United States Patent
Hsu et al.

(10) Patent No.: US 9,093,342 B2
(45) Date of Patent: Jul. 28, 2015

(54) OPTICAL SENSOR CAPABLE OF DETECTING IR LIGHT AND VISIBLE LIGHT SIMULTANEOUSLY

(75) Inventors: En-Feng Hsu, Hsin-Chu (TW); Chi-Chieh Liao, Hsin-Chu (TW)

(73) Assignee: PixArt Imaging Inc., Science Based Industrial Park, Hsin-Chu (TW)

( * ) Notice: Subject to any disclaimer, the term of this patent is extended or adjusted under 35 U.S.C. 154(b) by 561 days.

(21) Appl. No.: 13/427,912

(22) Filed: Mar. 23, 2012

(65) Prior Publication Data

US 2012/0241618 A1  Sep. 27, 2012

(30) Foreign Application Priority Data

Mar. 25, 2011  (TW) .............................. 100110307 A (51) Int. Cl.
*H01L 27/14* (2006.01)
*H01L 27/146* (2006.01)

(52) U.S. Cl.
CPC ...... *H01L 27/14621* (2013.01); *H01L 27/1462* (2013.01); *H01L 27/14647* (2013.01)

(58) Field of Classification Search
CPC ..................... H01L 31/0232; H01L 27/14621; H01L 27/14687
USPC .......................... 250/339.01, 339.05; 257/432
See application file for complete search history.

(56) References Cited

U.S. PATENT DOCUMENTS

| 7,714,265 B2 | 5/2010 | Fadell |
| 8,564,580 B2 | 10/2013 | Sakai |
| 2008/0191298 A1* | 8/2008 | Lin et al. ....................... 257/432 |

FOREIGN PATENT DOCUMENTS

| CN | 1310915 A | 8/2001 |
| CN | 101447145 A | 6/2009 |
| TW | 482893 | 4/2002 |

* cited by examiner

*Primary Examiner* — Casey Bryant
(74) *Attorney, Agent, or Firm* — Winston Hsu; Scott Margo (57) ABSTRACT

An optical sensor includes an image sensor, a proximity sensor and a visible light sensor. The image sensor includes a first pixel and a second pixel. The first pixel is coated with a first optical film for blocking light whose wavelength is outside a first predetermined range and a second optical film for blocking light whose wavelength is outside a second predetermined range. The proximity sensor generates an IR signal according to a first exposure value. The visible light sensing unit generates a visible light signal according to the difference between the first exposure and a second exposure value or according to a ratio of the first exposure value to the second exposure value. The first exposure value represents an incident light quantity which is absorbed by the first pixel. The second exposure value represents an incident light quantity which is absorbed by the second pixel.

4 Claims, 12 Drawing Sheets

OPTICAL SENSOR CAPABLE OF DETECTING IR LIGHT AND VISIBLE LIGHT SIMULTANEOUSLY

BACKGROUND OF THE INVENTION

1. Field of the Invention

The present invention is related to an optical sensor, and more particularly, to an optical sensor capable of detecting IR light and visible light simultaneously.

2. Description of the Prior Art

Light is the portion of electromagnetic radiation whose wavelength is between 300 nm (ultraviolet) to 14,000 nm (far infrared). The wavelength of visible light lies in a range from about 380 to about 780 nm. Infrared radiation (IR) is the portion of electromagnetic radiation whose wavelength is between 780 nm to 1400 nm. With high thermal efficiency, strong penetration and easy absorption, IR imaging is used extensively for communication, probing, medical and military purposes.

An optical sensor is used for converting optical signals into electrical signals using an image sensor capable of detecting light in a wavelength range of 400-1000 nm. Visible light sensors are commonly used for controlling environmental brightness. IR sensors, also called proximity sensors, are often used for surveillance purposes.

Figure 1:
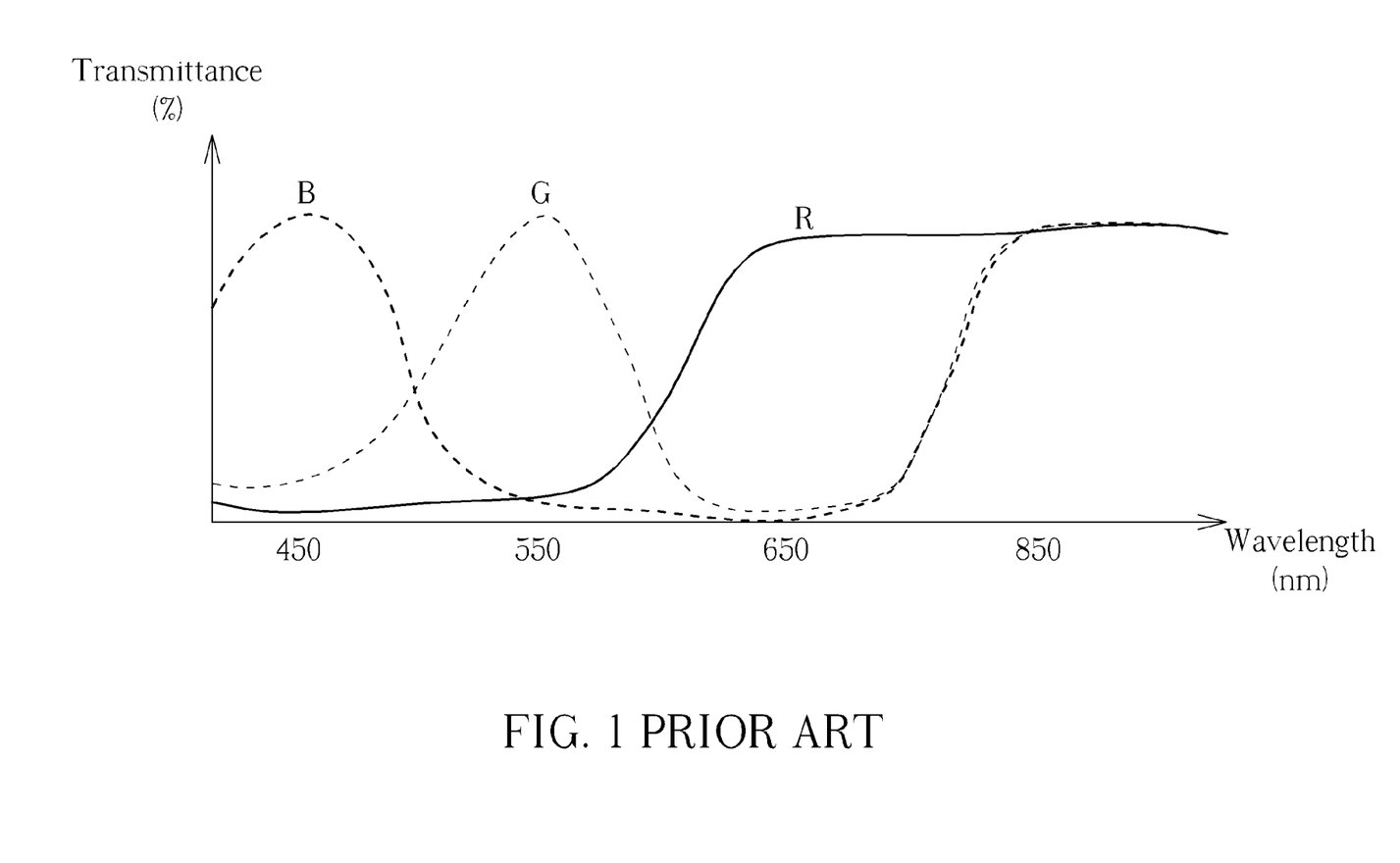
FIG. 1 illustrates the optical spectrum measured by a prior art visible light sensor.

FIG. 1 illustrates the optical spectrum measured by a prior art visible light sensor. Curves R, G and B represent the transmittance-wavelength characteristics of the red, green and blue visible light, respectively. As previously explained, human eyes are unable to perceive invisible light whose wavelength is larger than 780 nm. However, the prior art visible light sensor may detect peaks in the non-visible range of the optical spectrum which results in inaccurate results. For example, when the intensity of ambient light becomes insufficient to human eyes, the prior art visible light sensor may provide an inaccurate result of sufficient ambient light due to the detection of invisible light. Therefore, optical sensors are required to simultaneously include functions of the visible light sensor and the proximity sensor in many applications.

In US Patent Application No. US 2006/0180886, a visible light sensor having a multi-layer filter structure by alternatively fabricating Ag and Si3N4 layers on an optical device is disclosed. The thickness of each layer in the multi-layer filter structure is determined according to Fabry-Perot interference principle so that each region of the optical device may detect a specific wavelength range for blocking IR light. However, this prior art requires complicated manufacturing processes which may reduce product yield or increase manufacturing costs.

SUMMARY OF THE INVENTION

The present invention provides an optical sensor including an image sensor and a processing unit. The image sensor includes a first pixel and a second pixel. The first pixel is coated with a first optical film configured to block light whose wavelength is outside a first predetermined range and a second optical film configured to block light whose wavelength is outside a second predetermined range. The processing unit is configured to simultaneously receive pixel data measured by the first pixel and the second pixel and generate an electrical signal accordingly.

The present invention also provides an optical sensor including an image sensor and a processing unit. The image sensor includes a first pixel and a second pixel. The first pixel is coated with a first optical film configured to block light whose wavelength is outside a first predetermined range and a second optical film configured to block light whose wavelength is outside a second predetermined range. The second pixel is coated with a third optical film configured to block light whose wavelength is outside a third predetermined range. The processing unit is configured to simultaneously receive pixel data measured by the first pixel and the second pixel and generate an electrical signal accordingly.

These and other objectives of the present invention will no doubt become obvious to those of ordinary skill in the art after reading the following detailed description of the preferred embodiment that is illustrated in the various figures and drawings.

DETAILED DESCRIPTION

For ease and clarity of explanation, elements which are not directly associated with the present invention are omitted when describing preferred embodiments of the present invention. Meanwhile, the size and location of each described device are merely for illustrative purpose and do not intend to limit the scope of the present invention.

Figure 2A:
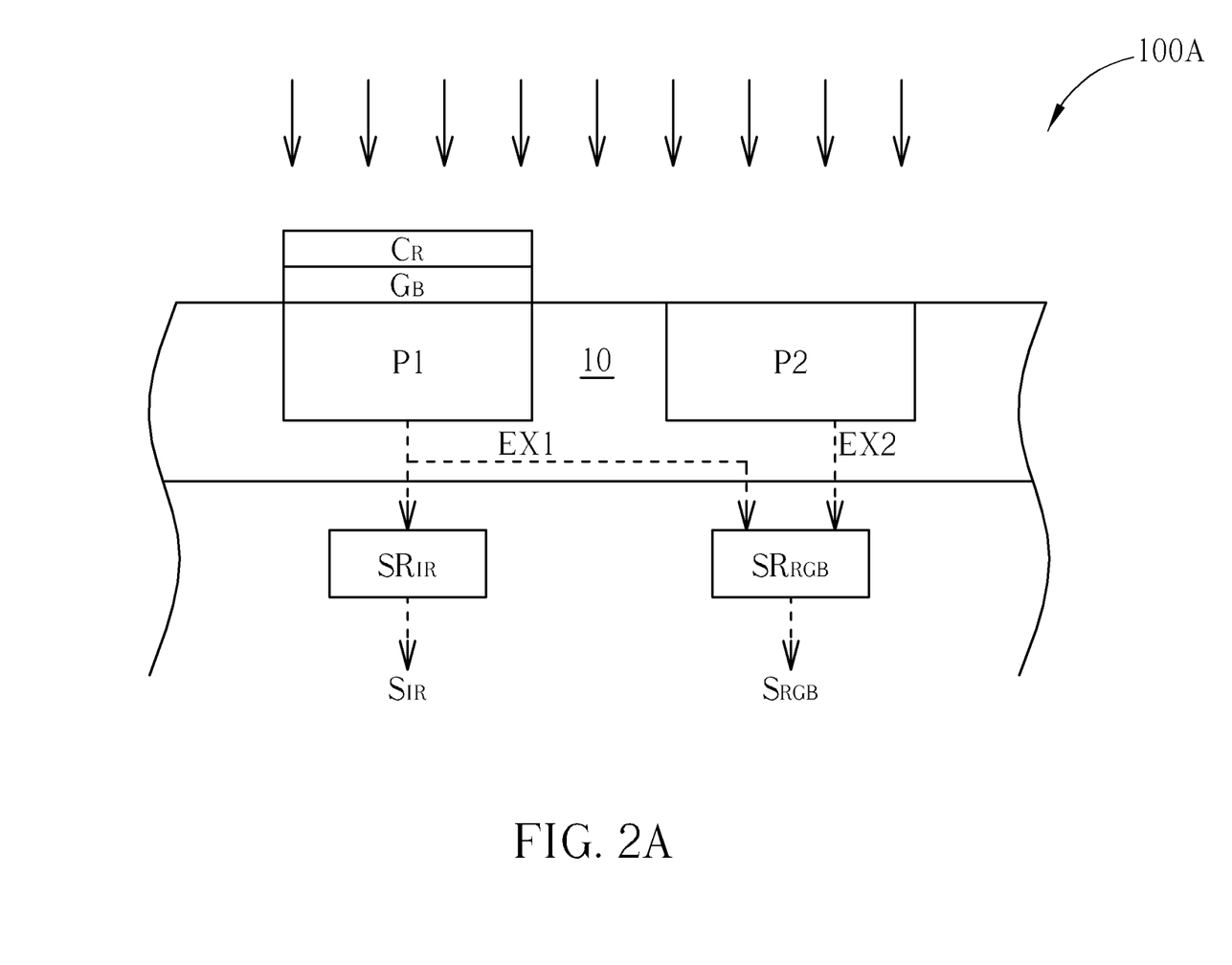
FIGS. 2A-2C are diagrams illustrating optical sensors according to a first embodiment of the present invention.
Figure 2B:
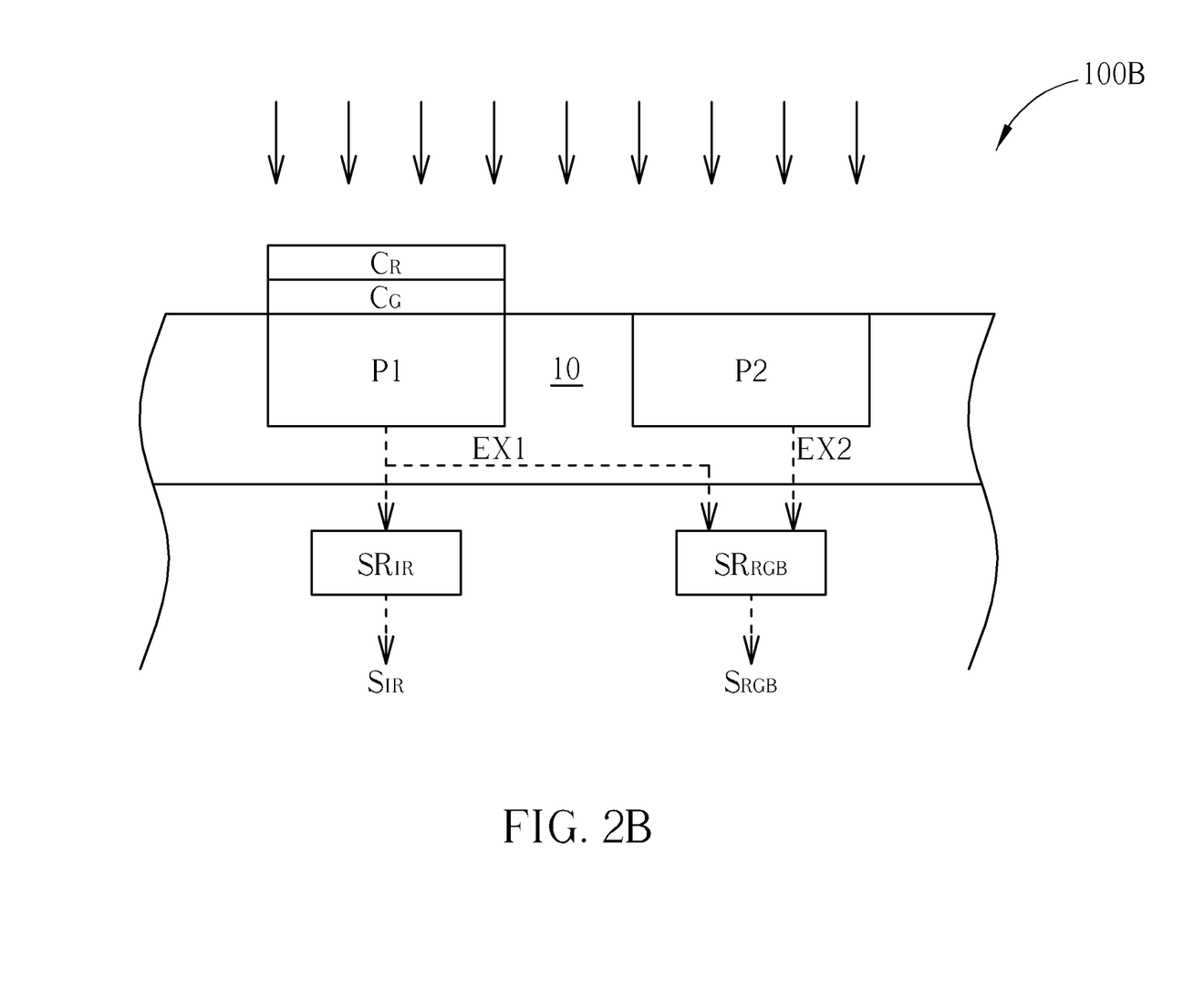
Figure 2C:
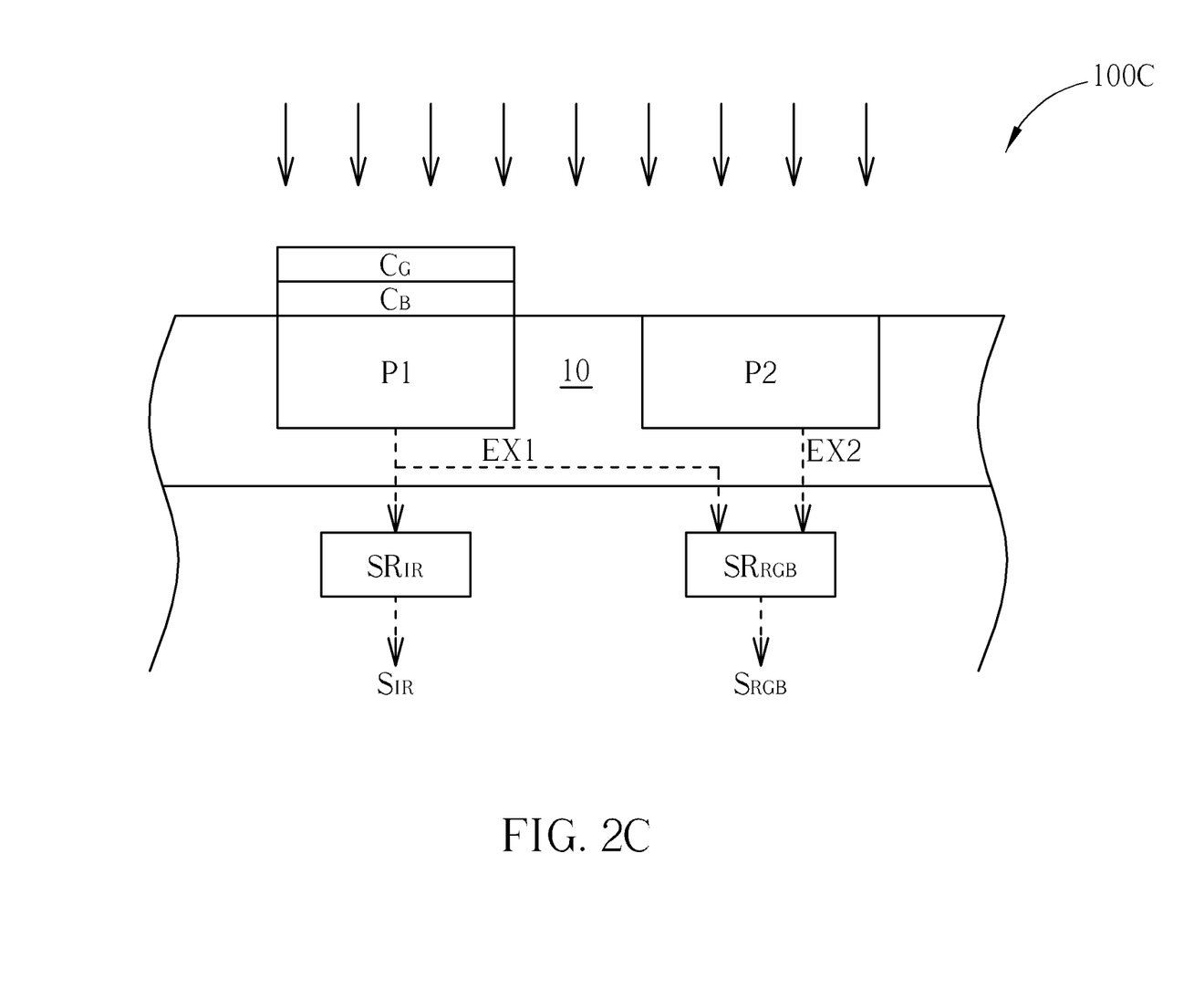

FIGS. 2A-2C are diagrams illustrating optical sensors 100A-100C according to a first embodiment of the present invention. Each of the optical sensors 100A-100C includes an image sensor 10, a proximity sensor $SR_{IR}$, and a visible light sensor $SR_{RGB}$. The image sensor 10 includes a pixel P1 coated with two types of optical films and a pixel P2 without any coating. The pixels P1 and P2 of the image sensor 10 may absorb light and generate corresponding electrical signals. The proximity sensor $SR_{IR}$ and the visible light sensor $SR_{RGB}$ are signal processors capable of determining the intensity of visible light or IR light according to the electrical signals received from the pixels P1 and P2.

In the optical sensor 100A according to the first embodiment of the present invention, the pixel P1 is coated with a red optical film $C_R$ and a blue optical film $C_B$, wherein the red optical film $C_R$ only transmits the red visible light (i.e. blocking light whose wavelength is not between 600-780 nm) and the blue optical film $C_B$ only transmits the blue visible light (i.e. blocking light whose wavelength is not between 380-500 nm). The blue optical film $C_B$ may block the red visible light after it passes through the red optical film $C_R$, while the red optical film $C_R$ may block the blue visible light after it passes through the blue optical film $C_B$. Therefore, regardless of the sequence of fabricating the red optical film $C_R$ and the blue optical film $C_B$ on the pixel P1, only the IR light can reach the pixel P1. FIG. 2A only illustrates an embodiment of the present invention. The sequence of fabricating the red optical film $C_R$ and the blue optical film $C_B$ on the pixel P1 does not limit the scope of the present invention.

In the optical sensor 100B according to the first embodiment of the present invention, the pixel P1 is coated with a red optical film $C_R$ and a green optical film $C_G$, wherein the red optical film $C_R$ only transmits the red visible light (i.e. blocking light whose wavelength is not between 600-780 nm) and the green optical film $C_G$ only transmits the green visible light (i.e. blocking light whose wavelength is not between 500-600 nm). The green optical film $C_G$ may block the red visible light after it passes through the red optical film $C_R$, while the red optical film $C_R$ may block the green visible light after it passes through the green optical film $C_G$. Therefore, regardless of the sequence of fabricating the red optical film $C_R$ and the green optical film $C_G$ on the pixel P1, only the IR light can reach the pixel P1. FIG. 2B only illustrates an embodiment of the present invention. The sequence of fabricating the red optical film $C_R$ and the green optical film $C_G$ on the pixel P1 does not limit the scope of the present invention.

In the optical sensor 100C according to the first embodiment of the present invention, the pixel P1 is coated with a green optical film $C_G$ and a blue optical film $C_B$, wherein the green optical film $C_G$ only transmits the green visible light (i.e. blocking light whose wavelength is not between 500-600 nm) and the blue optical film $C_B$ only transmits the blue visible light (i.e. blocking light whose wavelength is not between 380-500 nm). The green optical film $C_G$ may block the red visible light after it passes through the red optical film $C_R$, while the red optical film $C_R$ may block the green visible light after it passes through the green optical film $C_G$. Therefore, regardless of the sequence of fabricating the green optical film $C_G$ and the blue optical film $C_B$ on the pixel P1, only the IR light can reach the pixel P1. FIG. 2C only illustrates an embodiment of the present invention. The sequence of fabricating the green optical film $C_G$ and the blue optical film $C_B$ on the pixel P1 does not limit the scope of the present invention.

As previously explained, after absorbing the incident IR light after it passes through two types of optical films, an incident light quantity absorbed by the pixel P1 is represented by a first exposure value EX1. After absorbing the incident IR light and the visible light, an incident light quantity absorbed by the pixel P2 is represented by a second exposure value EX2. The proximity sensor $SR_{IR}$ is configured to generate an IR electrical signal $S_{IR}$ according to the exposure value EX1. The visible light sensor $SR_{RGB}$ is configured to generate a visible light electrical signal $S_{RGB}$ according to the difference between the exposure values EX1 and EX2 or according to the ratio of the exposure value EX1 to the exposure value EX2. The exposure values EX1, EX2 and the electrical signals $S_{IR}$, $S_{RGB}$ may be voltage signals or current signals.

Figure 3:
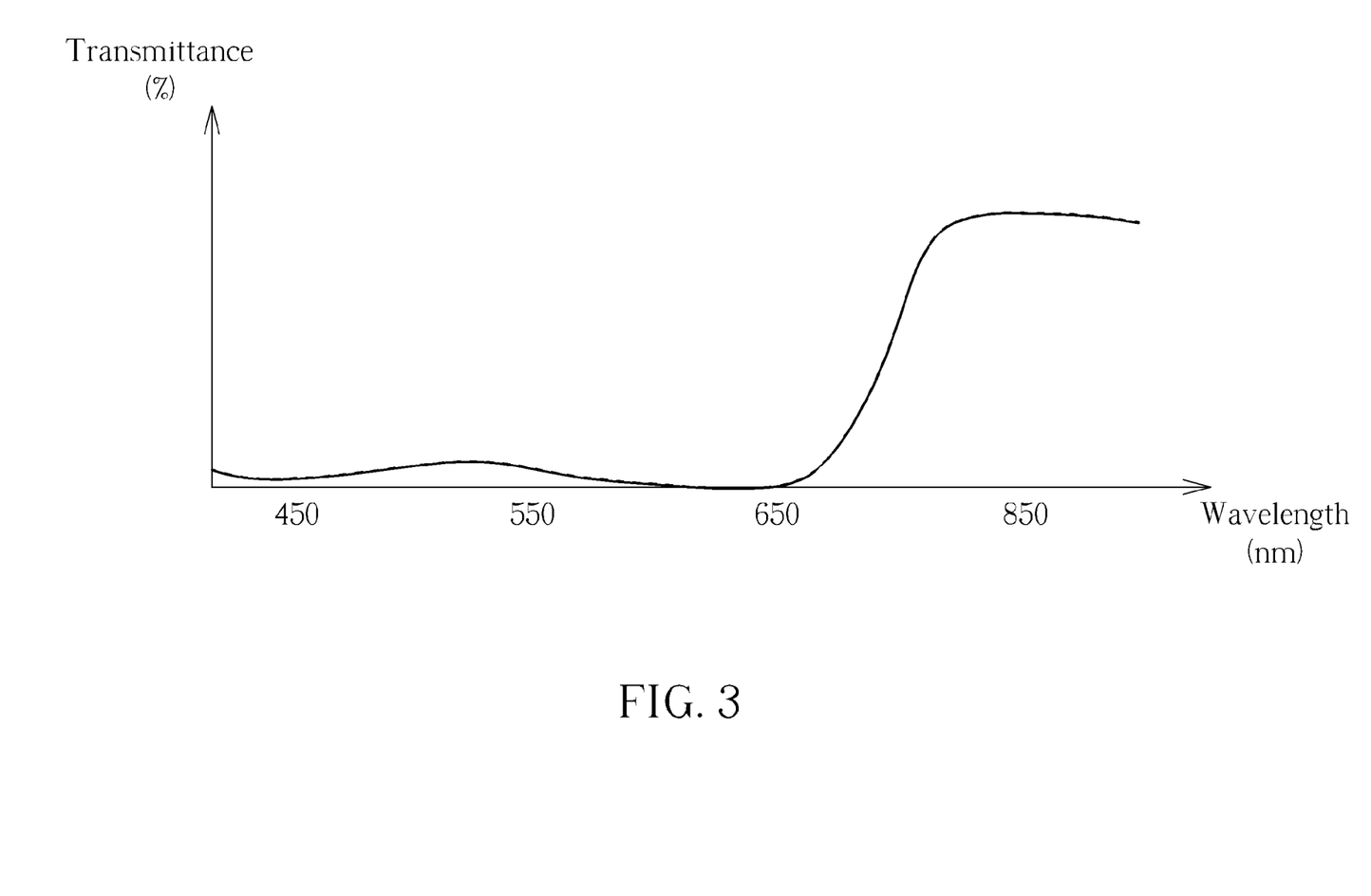
FIG. 3 is the optical spectrum associated with the IR electrical signal generated by the present optical sensor.
Figure 4:
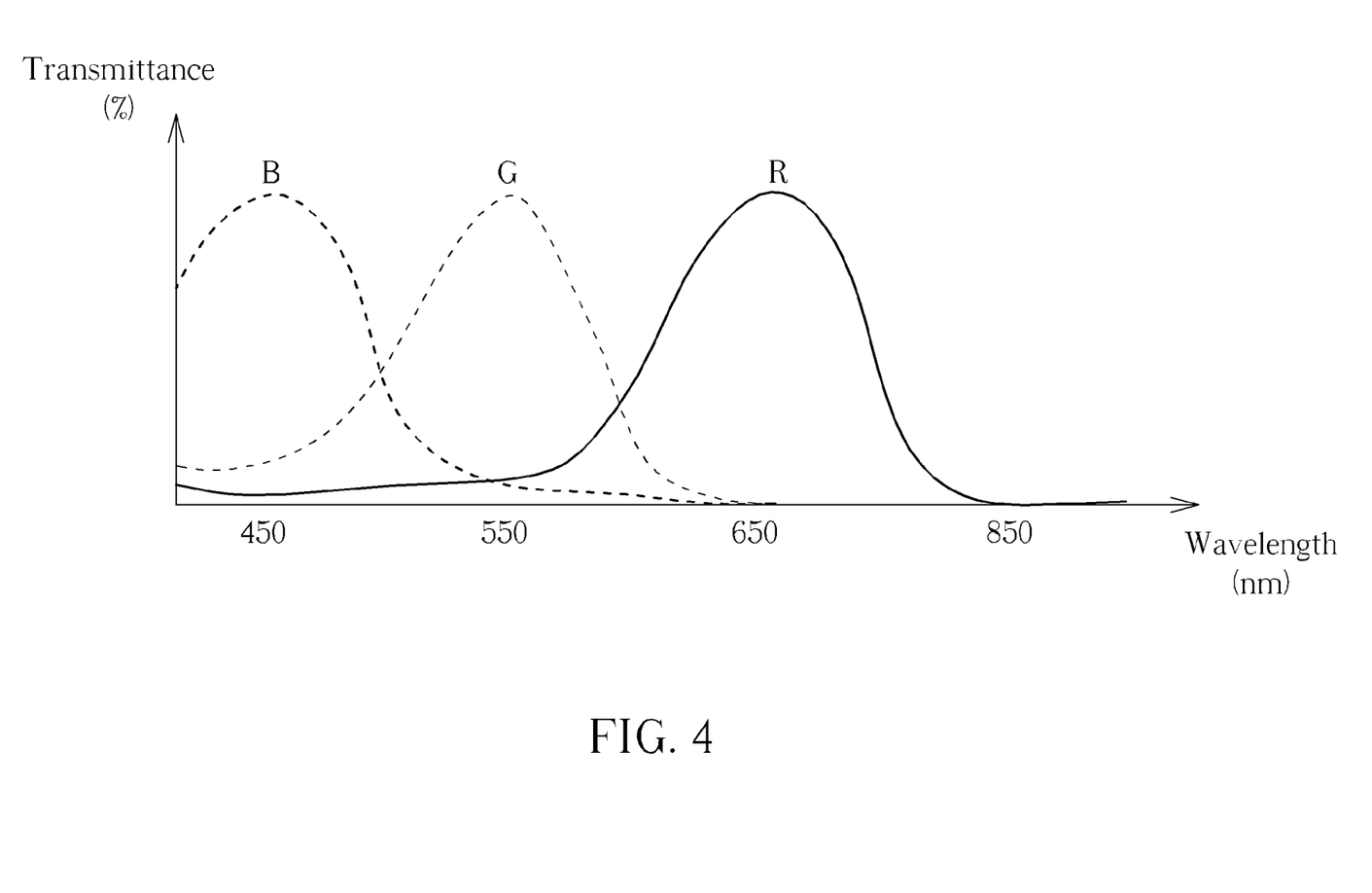
FIG. 4 is the optical spectrum associated with the visible light electrical signal generated by the present optical sensor.

FIG. 3 illustrates the optical spectrum associated with the IR electrical signal $S_{IR}$ generated by the optical sensors 100A-100C. FIG. 4 illustrates the optical spectrum associated with the visible light electrical signal $S_{RGB}$ generated by the optical sensors 100A-100C. The vertical axis represents transmittance (%), and the horizontal axis represents wavelength (nm). In the optical sensors 100A-100C of the present invention, the intensity of the IR light may be measured by the proximity sensor $SR_{IR}$, and the intensity of the visible light may be measured by the visible light sensor $SR_{RGB}$.

Figure 5A:
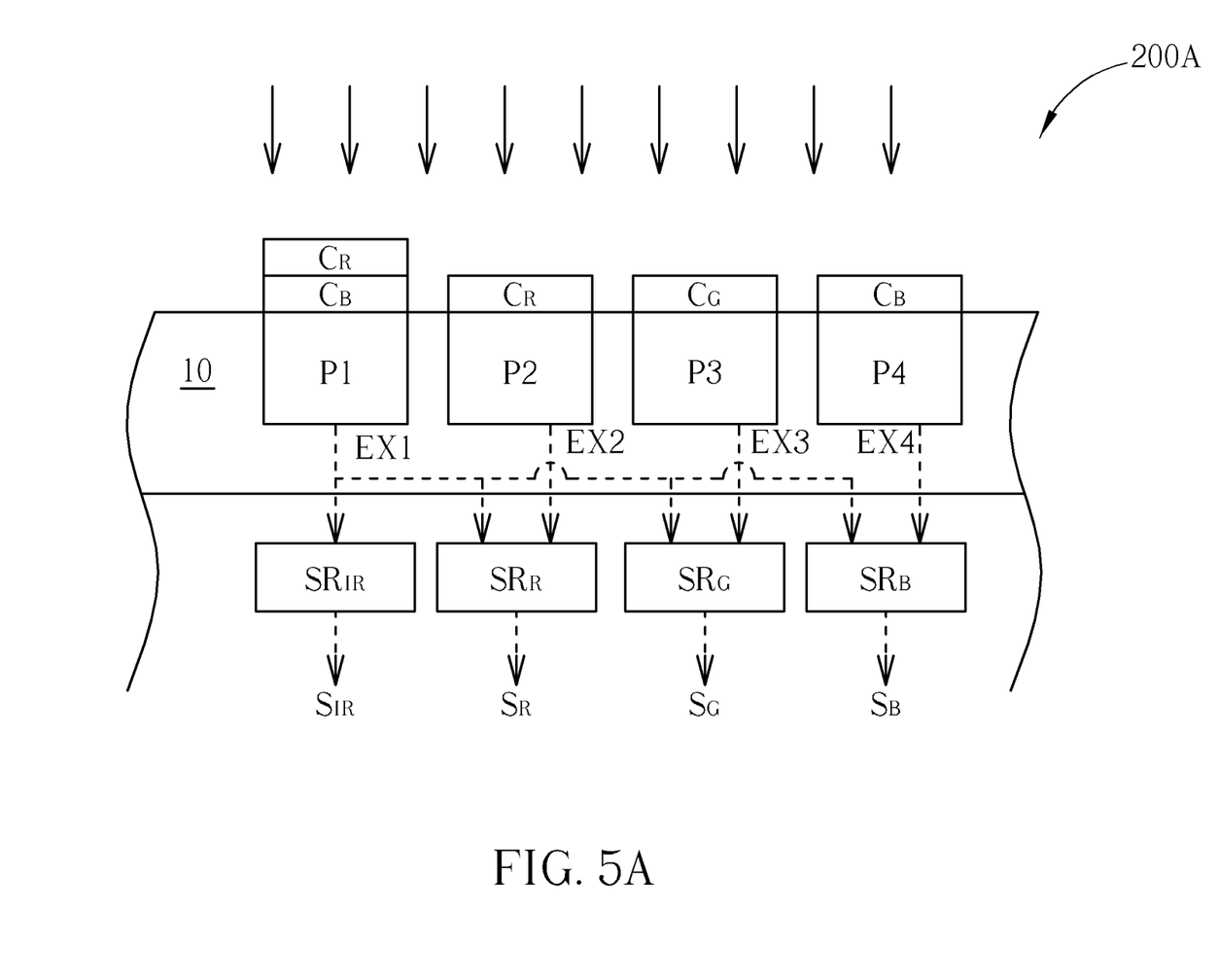
FIGS. 5A-5C are diagrams illustrating optical sensors according to a second embodiment of the present invention.
Figure 5B:
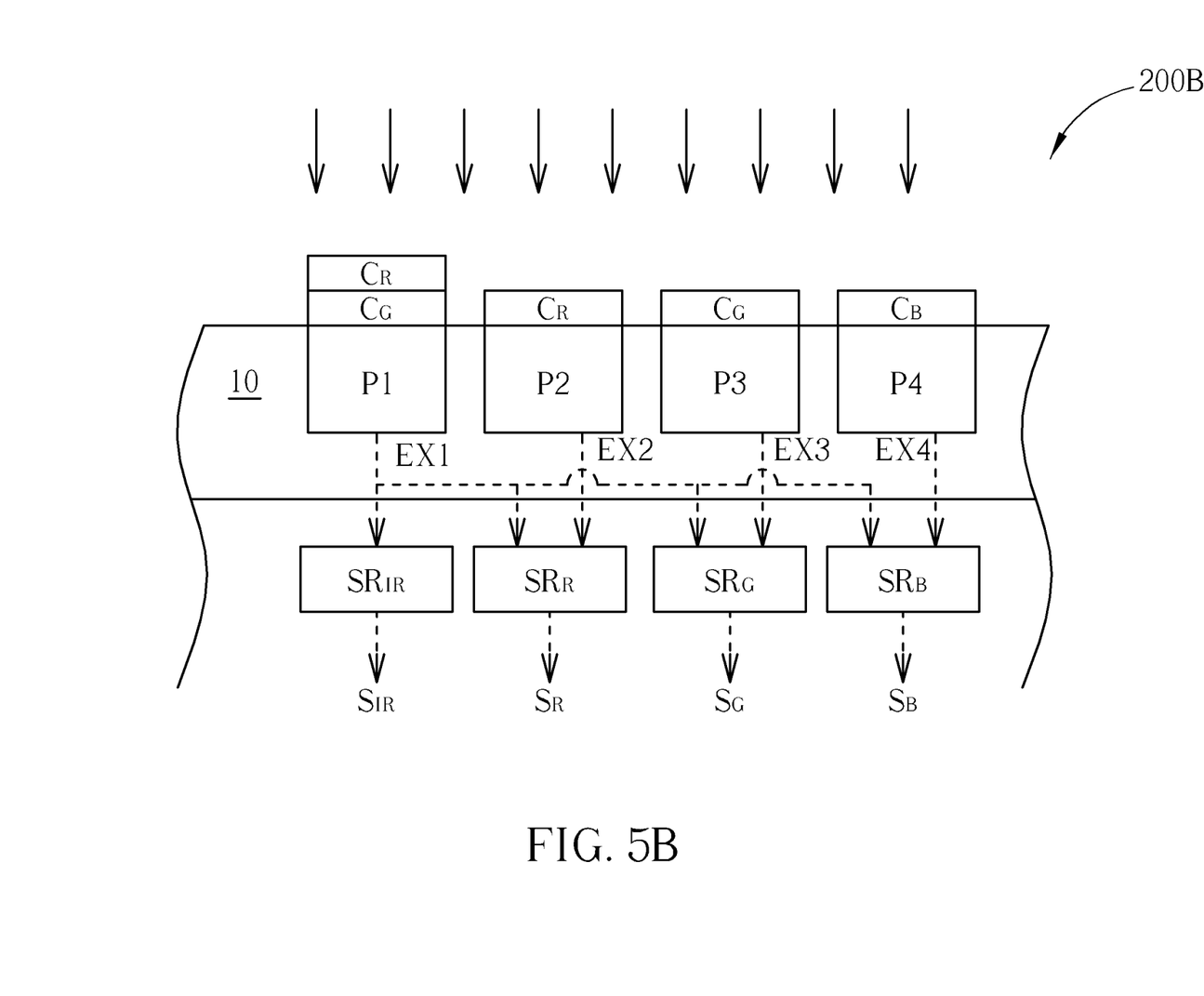
Figure 5C:
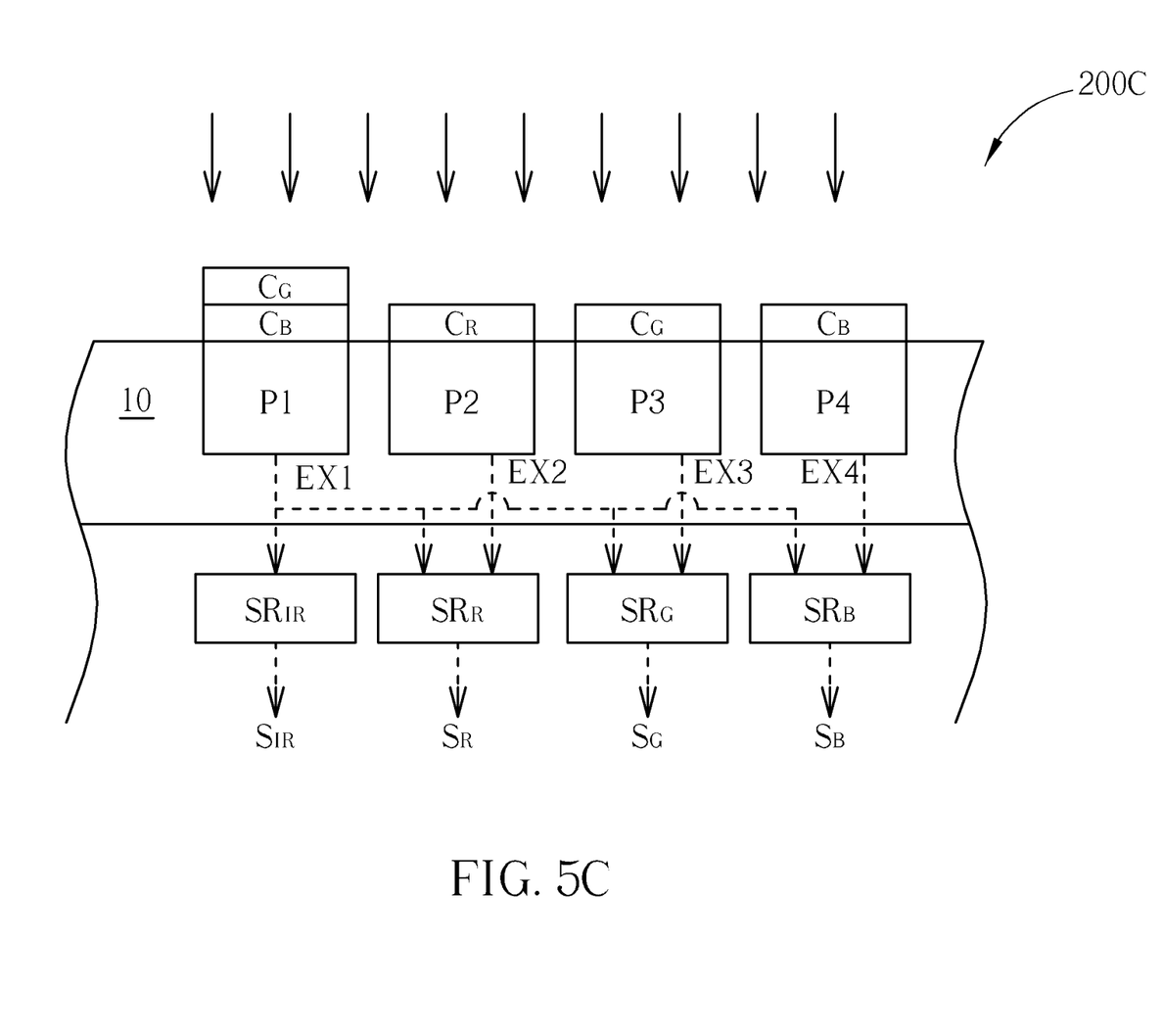

FIGS. 5A-5C are diagrams illustrating optical sensors 200A-200C according to a second embodiment of the present invention. Each of the optical sensors 200A-200C includes an image sensor 10, a proximity sensor $SR_{IR}$, a red visible light sensor $SR_R$, a green visible light sensor $SR_G$, and a blue visible light sensor $SR_B$. The image sensor 10 includes four pixels P1-P4: the pixel P1 is coated with two types of optical films, while each of the pixels P2-P4 is coated a specific type of optical film. The pixels P1-P4 of the image sensor 10 may absorb light and generate corresponding electrical signals. The proximity sensor $SR_{IR}$, the red visible light sensor $SR_R$, the green visible light sensor $SR_G$, and the blue visible light sensor $SR_B$ are signal processors capable of determining the intensity of each visible light or IR light according to the electrical signals received from the pixels P1-P4.

In the optical sensor 200A according to the second embodiment of the present invention, the pixel P1 is coated with a red optical film $C_R$ and a blue optical film $C_B$. In the optical sensor 200B according to the second embodiment of the present invention, the pixel P1 is coated with a red optical film $C_R$ and a green optical film $C_G$. In the optical sensor 200C according to the second embodiment of the present invention, the pixel P1 is coated with a green optical film $C_G$ and a blue optical film $C_B$. The red optical film $C_R$ only transmits the red visible light (i.e. blocking light whose wavelength is not between 600-780 nm). The green optical film $C_G$ only transmits the green visible light (i.e. blocking light whose wavelength is not between 500-600 nm). The blue optical film $C_B$ only transmits the blue visible light (i.e. blocking light whose wavelength is not between 380-500 nm). As previously explained, a specific type of visible light capable of passing though a specific optical film may be blocked by another type of optical film. Therefore, regardless of the sequence of fabricating the red optical film $C_R$, the green optical film $C_G$ or the blue optical film $C_B$ on the pixel P1, only the IR light can reach the pixel P1. FIGS. 5A-5C only illustrate embodiments of the present invention. The sequence of fabricating the red optical film $C_R$, the green optical film $C_G$ and the blue optical film $C_B$ on the pixel P1 does not limit the scope of the present invention.

Meanwhile, in the optical sensors 200A-200C according to the second embodiment of the present invention, the pixel P2 is coated with a red optical film $C_R$, the pixel P3 is coated with a green optical film $C_G$, and the pixel P4 is coated with a blue optical film $C_B$. The red optical film $C_R$ only transmits the red visible light (i.e. blocking light whose wavelength is not between 600-780 nm). The green optical film $C_G$ only transmits the green visible light (i.e. blocking light whose wavelength is not between 500-600 nm). The blue optical film $C_B$ only transmits the blue visible light (i.e. blocking light whose wavelength is not between 380-500 nm). Therefore, only the red visible light can reach the pixel P2, only the green visible light can reach the pixel P3, and only the blue visible light can reach the pixel P4.

As previously explained, after absorbing the incident IR light after it passes through two types of optical films, an incident light quantity absorbed by the pixel P1 is represented by a first exposure value EX1. After absorbing the incident IR light and the red visible light passing through one optical film, an incident light quantity absorbed by the pixel P2 is represented by a second exposure value EX2. After absorbing the incident IR light and the green visible light passing through one optical film, an incident light quantity absorbed by the pixel P3 is represented by a third exposure value EX3. After absorbing the incident IR light and the blue visible light passing through one optical film, an incident light quantity absorbed by the pixel P4 is represented by a fourth exposure value EX4. The proximity sensor $SR_{IR}$ is configured to generate an IR electrical signal $S_{IR}$ according to the exposure value EX1. The red visible light sensor $SR_R$ is configured to generate a red visible light electrical signal $S_R$ according to the difference between the exposure values EX1 and EX2 or according to the ratio of the exposure value EX1 to the exposure value EX2. The green visible light sensor $SR_S$ is configured to generate a green visible light electrical signal $S_G$ according to the difference between the exposure values EX1 and EX3 or according to the ratio of the exposure value EX1 to the exposure value EX3. The blue visible light sensor $SR_B$ is configured to generate a blue visible light electrical signal $S_R$ according to the difference between the exposure values EX1 and EX4 or according to the ratio of the exposure value EX1 to the exposure value EX4. The exposure values EX1-EX4 and the electrical signals $S_{IR}$, $S_R$, $S_G$, and $S_R$ may be voltage signals or current signals.

Figure 6:
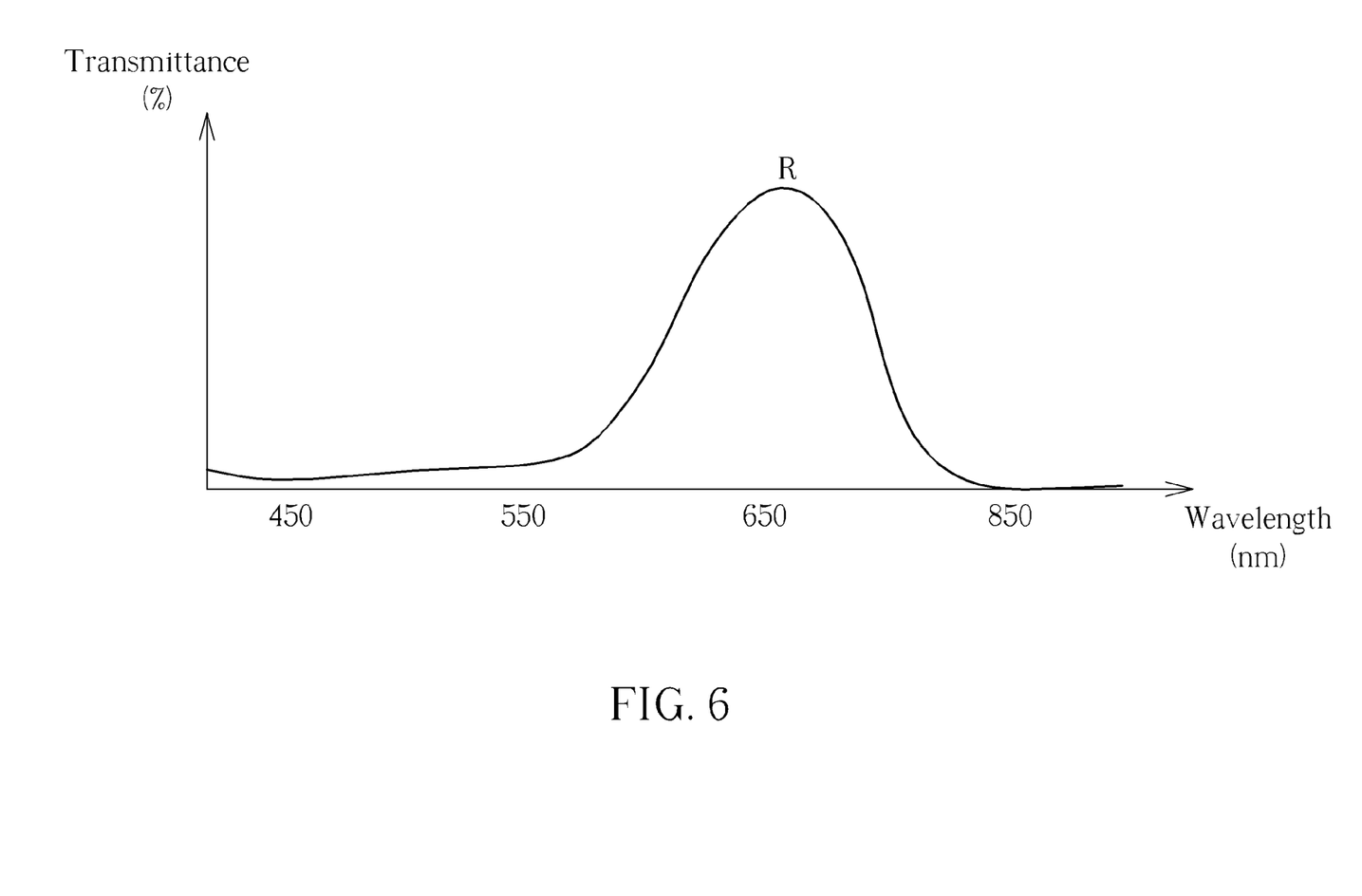
FIG. 6 is the optical spectrum associated with the red visible light electrical signal generated by the present optical sensor.
Figure 7:
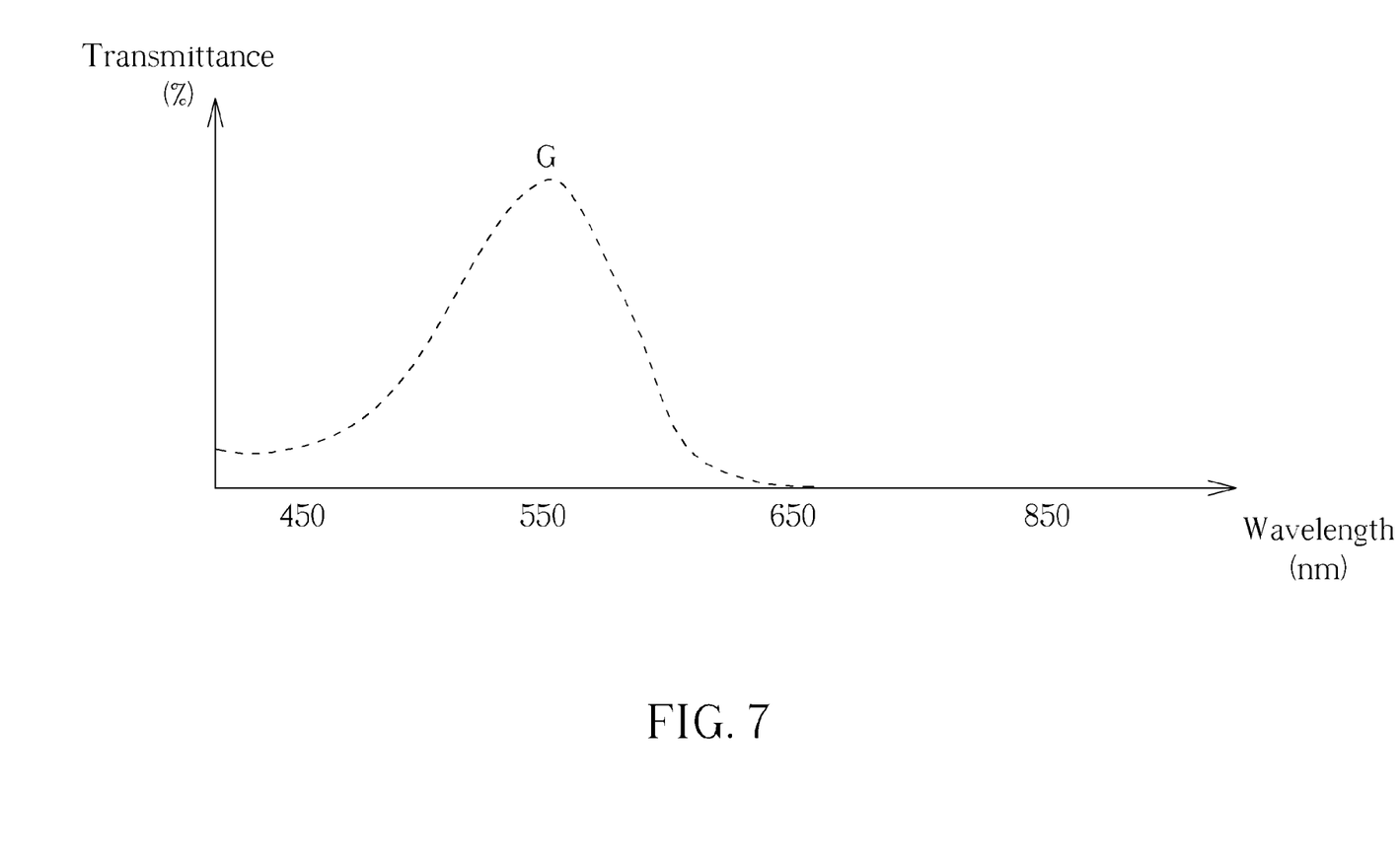
FIG. 7 is the optical spectrum associated with the green visible light electrical signal generated by the present optical sensor.
Figure 8:
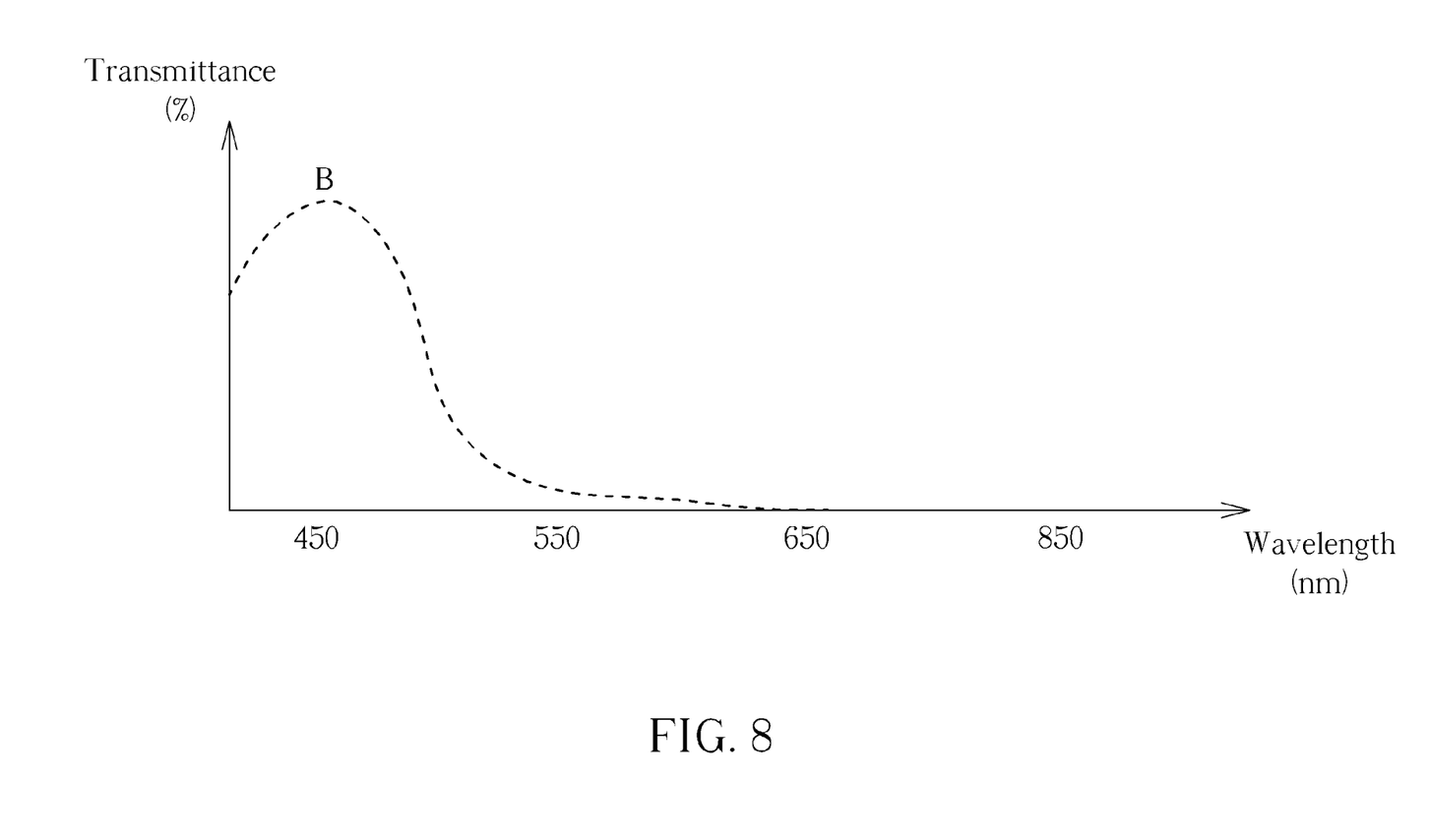
FIG. 8 is the optical spectrum associated with the blue visible light electrical signal generated by the present optical sensor.

FIG. 3 also illustrates the optical spectrum associated with the IR electrical signal $S_{IR}$ generated by the optical sensors 200A-200C. FIG. 6 illustrates the optical spectrum associated with the red visible light electrical signal $S_R$ generated by the optical sensors 200A-200C. FIG. 7 illustrates the optical spectrum associated with the green visible light electrical signal $S_G$ generated by the optical sensors 200A-200C. FIG. 8 illustrates the optical spectrum associated with the blue visible light electrical signal $S_R$ generated by the optical sensors 200A-200C. The vertical axis represents transmittance (%), and the horizontal axis represents wavelength (nm). In the optical sensors 200A-200C of the present invention, the intensity of the IR light may be measured by the proximity sensor $SR_{IR}$, and the intensity of each visible light may be measured by the corresponding visible light sensor $SR_R$, $SR_G$, and $SR_R$.

In conclusion, the optical sensor according to the present invention only requires simple manufacturing process, and can provide functions of the proximity sensor and the visible light sensor using different optical films.

Those skilled in the art will readily observe that numerous modifications and alterations of the device and method may be made while retaining the teachings of the invention.

What is claimed is:

1. An optical sensor, comprising:
  an image sensor, comprising:
    a first pixel coated with two optical films, wherein a first optical film is configured to block light whose wavelength is outside a first predetermined range, and a second optical film is on the first optical film and configured to block light whose wavelength is outside a second predetermined range; and
    a second pixel without being coated with any optical film; and
  a processing unit configured to simultaneously receive pixel data measured by the first pixel and the second pixel and generate an electrical signal accordingly, wherein the first predetermined range and the second predetermined range are not overlapped.

2. The optical sensor of claim 1, wherein the first predetermined range and the second predetermined range are different and selected from 380-500 nm, 500-600 nm, and 600-780 nm.

3. The optical sensor of claim 1, wherein the processing unit comprises a proximity sensor configured to generate an infrared radiation (IR) electrical signal according to a first exposure value, wherein the first exposure value represents an incident light quantity which is absorbed by the first pixel.

4. The optical sensor of claim 1, wherein the processing unit comprises a visible light sensor configured to generate a visible light electrical signal according to a difference between a first exposure value and a second exposure value or according to a ratio of the first exposure value to the second exposure value, wherein the first exposure value represents an incident light quantity which is absorbed by the first pixel, and the second exposure value represents an incident light quantity which is absorbed by the second pixel.

* * * * *